United States Patent
Lin et al.

(10) Patent No.: US 8,592,320 B2
(45) Date of Patent: Nov. 26, 2013

(54) METHOD FOR FORMING FIN-SHAPED SEMICONDUCTOR STRUCTURE

(75) Inventors: Chih-Ching Lin, Taoyuan County (TW); Yi-Nan Chen, Taoyuan County (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 220 days.

(21) Appl. No.: 13/210,172

(22) Filed: Aug. 15, 2011

(65) Prior Publication Data

US 2013/0045600 A1 Feb. 21, 2013

(51) Int. Cl.
*H01L 21/302* (2006.01)

(52) U.S. Cl.
USPC ........... 438/719; 738/723; 738/735; 738/737; 738/738

(58) Field of Classification Search
None
See application file for complete search history.

(56) References Cited

U.S. PATENT DOCUMENTS

| 2005/0186746 A1* | 8/2005 | Lee et al. | 438/300 |
| 2006/0110928 A1* | 5/2006 | Degroote | 438/719 |
| 2009/0057846 A1* | 3/2009 | Doyle et al. | 257/623 |
| 2011/0263094 A1* | 10/2011 | Lin et al. | 438/425 |

* cited by examiner

*Primary Examiner* — Anita Alanko

(57) ABSTRACT

A method for fabricating a fin-shaped semiconductor structure is provided, including: providing a semiconductor substrate with a semiconductor island and a dielectric layer formed thereover; forming a mask layer over the semiconductor island and the dielectric layer; forming an opening in the mask layer, exposing a top surface of the semiconductor island and portions of the dielectric layer adjacent to the semiconductor island; performing an etching process, simultaneously etching portions of the mask layer, and portions of the semiconductor island and the dielectric layer exposed by the opening; and removing the mask layer and the dielectric layer, leaving an etched semiconductor island with curved top surfaces and various thicknesses over the semiconductor substrate.

10 Claims, 4 Drawing Sheets

US 8,592,320 B2

METHOD FOR FORMING FIN-SHAPED SEMICONDUCTOR STRUCTURE

BACKGROUND OF THE INVENTION

1. Field of the Invention

The present invention relates to semiconductor fabrication, in particularly to a method for fabricating a fin-shaped semiconductor structure.

2. Description of the Related Art

The escalating demands for high density and performance associated with ultra large scale integrated semiconductor devices require design features, such as gate lengths, to be below 100 nanometers (nm), high reliability and increased manufacturing throughput. The reduction of design features below 100 nm challenges the limitations of conventional methods.

For example, when the gate length of conventional planar metal oxide semiconductor field effect transistors (MOS-FETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are, therefore, being explored to improve FET performance and allow further device scaling.

A FinFET is a recent structure developed that exhibits good short channel behavior, including a channel formed in a vertical fin-shaped semiconductor structure. The FinFET may be fabricated using layout and process techniques similar to those used for conventional planar MOSFETs, however, fabrication of the vertical fin-shaped semiconductor structure of the FinFET, is problematic since an end point during an etching process for forming the vertical fin-shaped semiconductor structure cannot be determined by conventional interferometer end point (IEP) detection or optical emission spectroscopy (OES) detection. This is due to the non-planar surface configuration of the formed fin-shaped semiconductor structure such that a thickness and a shape of the vertical fin-shaped semiconductor structure cannot be precisely controlled by the above described end point detection methods.

BRIEF SUMMARY OF THE INVENTION

An exemplary method for fabricating a fin-shaped semiconductor structure comprises providing a semiconductor substrate with a semiconductor island and a dielectric layer formed thereover; forming a mask layer over the semiconductor island and the dielectric layer; forming an opening in the mask layer, exposing a top surface of the semiconductor island and portions of the dielectric layer adjacent to the semiconductor island; performing an etching process, simultaneously etching portions of the mask layer, and portions of the semiconductor island and the dielectric layer exposed by the opening; and removing the mask layer and the dielectric layer, leaving an etched semiconductor island with curved top surfaces and various thicknesses over the semiconductor substrate.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIG. 1-4 are cross sections of an exemplary method for fabricating a fin-shaped semiconductor structure with improved end point control during etching thereof.

Figure 1:
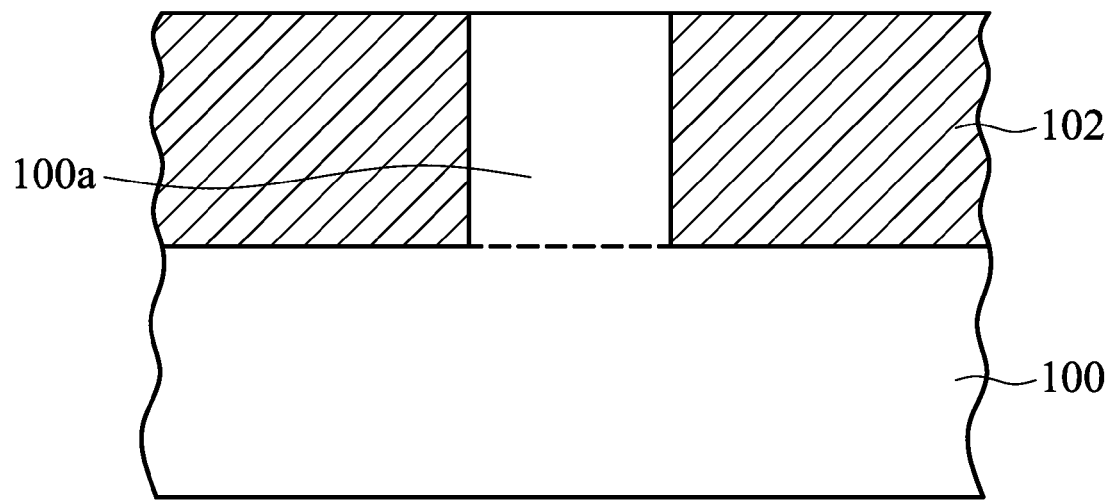
FIG. 1 is a cross section of a method for fabricating a fin-shaped semiconductor structure according to an embodiment of the invention, showing a structure after a planarization process.
Figure 2:
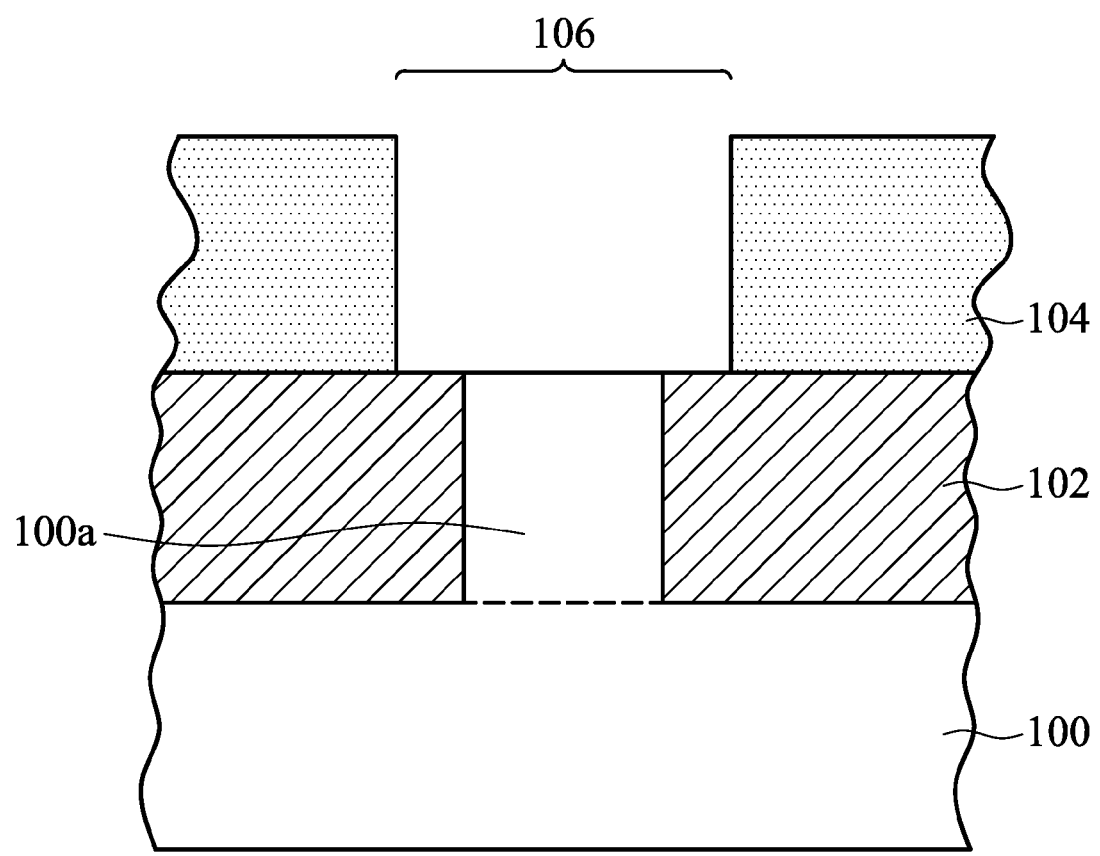
FIG. 2 is a cross section of a method for fabricating a fin-shaped semiconductor structure according to an embodiment of the invention, showing a structure after formation of a mask layer.

In FIG. 1, a semiconductor substrate 100 having a semiconductor island 100a and a dielectric layer 102 formed thereon is provided. The semiconductor substrate 100 can be, for example, a buck silicon substrate, and the semiconductor island 100a can be a portion of the semiconductor substrate 100 which is formed by patterning and removing portions of the semiconductor substrate 100. The dielectric layer 102 is formed by first depositing dielectric materials such as silicon oxide over the semiconductor substrate 100 and the semiconductor island 100a, and a planarization process (not shown) is then performed to remove the dielectric materials over a top surface of the semiconductor island 100a, thereby leaving the dielectric layer 102 adjacent to the semiconductor island 100a which is also coplanar therewith In FIG. 2, a mask layer 104 is then formed over the dielectric layer 102 and the semiconductor island 110a. The mask layer 104 is then patterned to form an opening 106 therein. As shown in FIG. 2, the opening 106 is formed through the mask layer 104 and exposes a top surface of the semiconductor island 100a and portions of the dielectric layer 102 adjacent thereto. The mask layer 104 may comprises materials such as photoresist or silicon nitride, which has an etching selectivity different from the materials of the semiconductor island 110a and the dielectric layer 102 thereunder.

Figure 3:
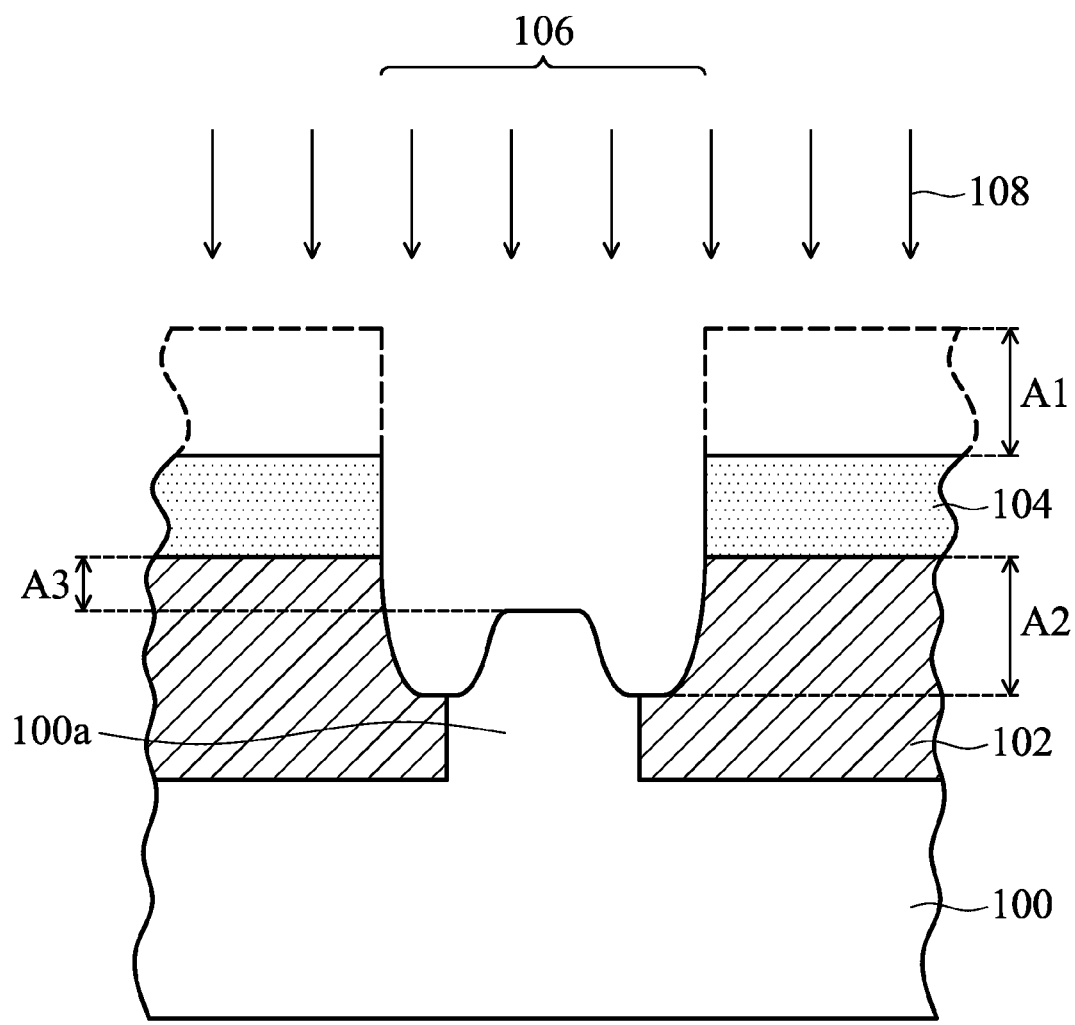
FIG. 3 is a cross section of a method for fabricating a fin-shaped semiconductor structure according to an embodiment of the invention, showing a structure after an etching process.

In FIG. 3, an etching process 108 for forming a fin-shaped semiconductor structure (see FIG. 4) of a semiconductor device such as a fin field effect transistor (FinFET) is performed, and the etching process 108 can be, for example, a dry etching process. As shown in FIG. 3, the etchants (not shown) used in the etching process 108 simultaneously remove portions of the mask layer 104, and portions the dielectric layer 102 and the semiconductor island 100a exposed by the opening 106. However, the etchants used in the etching process 108 show different etching rates to the materials of the mask layer 104, the dielectric layer 102, and the semiconductor island 100a such that a thickness A1 of the mask layer 104, a thickness of A2 of the dielectric layer 102, and a various thickness of about A2-A3 of the semiconductor island 100a are simultaneously removed during the etching process 108. In one embodiment, the thickness A2 represent a maximum thickness of the semiconductor island 100a removed in the etching process 108 and the thickness A3 represent a minimum thickness of the semiconductor island 100a removed in the etching process 108 such that the semiconductor island 100a has a various thickness decreasing from a central portion to an edge portion thereof. A ratio of the etching rates of the materials of the mask layer 104, the dielectric layer 102, and the semiconductor island 100a to the etchants used in the etching process 108 can be thus represented as, for example, A1:A2:A3 and pre-obtained by performing the same etching process 108 to a monitor (not shown) comprising materials of the mask layer 104 and the dielectric layer 102 or the semiconductor island 100a. Therefore, an etching rate correlation of the etchants used in the etching process 108 to the materials of the mask layer 104, the dielectric layer 102, and the semiconductor island 100a can be pre-set in an etching tool (not shown) for performing the etching process 108 and an end point of the etching process 108 can be pre-designed and pre-determined such that an etching time can be set prior to the etching process 108. Therefore, the conventional end point detection methods such as interferometer end point (IEP) detection or optical emission spectroscopy (OES) detection used in the conventional etching process can be replaced by the above time-mode end point control method.

Figure 4:
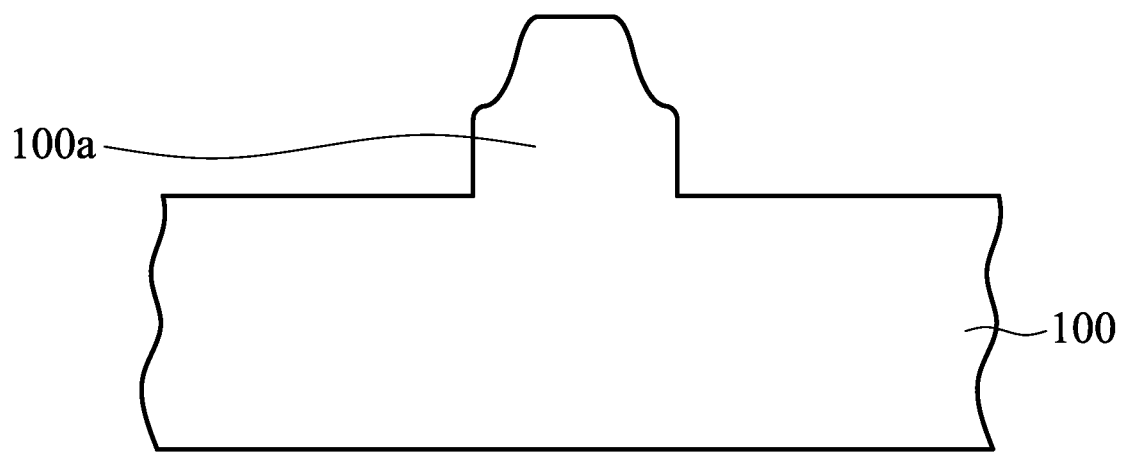
FIG. 4 is a cross section of a method for fabricating a fin-shaped semiconductor structure according to an embodiment of the invention, showing a formed fin-shaped semiconductor structure.

In FIG. 4, after the etching process 108 (shown in FIG. 3), the etched mask layer 104 and the etched dielectric layer 102 are entirely removed from the semiconductor substrate 100 and an etched semiconductor island 100a with curved top surfaces is formed over the semiconductor substrate 100. The etched semiconductor island 100a with curved top surfaces and various thicknesses may function as a vertical fin-shaped semiconductor structure for a semiconductor device such as a fin field effect transistor (FinFET) and other components such as a gate dielectric, source/drain regions and a gate electrode (not shown) can be then provided over the vertical fin-shaped semiconductor structure shown to form the FinFET (not shown).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a fin-shaped semiconductor structure, comprising:
   providing a semiconductor substrate with a semiconductor island and a dielectric layer formed thereover;
   forming a mask layer over the semiconductor island and the dielectric layer;
   forming an opening in the mask layer, exposing a top surface of the semiconductor island and portions of the dielectric layer adjacent to the semiconductor island;
   performing an etching process, simultaneously etching portions of the mask layer, and portions of the semiconductor island and the dielectric layer exposed by the opening; and
   removing the mask layer and the dielectric layer, leaving an etched semiconductor island with curved top surfaces and various thicknesses over the semiconductor substrate.

2. The method as claimed in claim 1, wherein thicknesses of the mask layer, the semiconductor island, and the dielectric layer are removed in the etching process.

3. The method as claimed in claim 1, wherein the etching process uses etchants showing different etching rates to materials of the mask layer, the semiconductor island, and the dielectric layer.

4. The method as claimed in claim 3, wherein the etchants used in the etching process have an etching rate correlation to the materials of the mask layer, the semiconductor island, and the dielectric layer pre-set in an etching tool for performing the etching process.

5. The method as claimed in claim 4, wherein an etching time of the etching process is pre-set based on the etching rate correlation of the etchants.

6. The method as claimed in claim 5, wherein an end point of the etching process is determined by the etching time of the etching process.

7. The method as claimed in claim 1, wherein the etching process is a dry etching process.

8. The method as claimed in claim 1, wherein the semiconductor substrate and the semiconductor island comprise silicon.

9. The method as claimed in claim 1, wherein the dielectric layer comprises silicon oxide.

10. The method as claimed in claim 1, wherein the mask layer comprises silicon nitride or photoresist.

* * * * *